United States Patent [19]
Tzou

[11] Patent Number: 5,858,618
[45] Date of Patent: Jan. 12, 1999

[54] PHOTOPOLYMERIZABLE RESINOUS COMPOSITION

[75] Inventor: Ming-Jen Tzou, Taipei, Taiwan

[73] Assignee: Nan Ya Plastics Corporation, Taipei, Taiwan

[21] Appl. No.: 753,876

[22] Filed: Dec. 2, 1996

[51] Int. Cl.$^6$ .............................. G03F 7/038; G03F 7/30
[52] U.S. Cl. .................................. 430/285.1; 430/288.1; 430/287.1; 430/280.1; 430/311; 522/103; 522/100; 522/101
[58] Field of Search .............................. 430/285.1, 288.1, 430/287.1, 280.1, 311; 522/103, 100, 101

[56] References Cited

U.S. PATENT DOCUMENTS

| | | | |
|---|---|---|---|
| 4,789,620 | 12/1988 | Sasaki et al. | 430/288.1 |
| 4,925,773 | 5/1990 | Miyamura et al. | 430/285.1 |

FOREIGN PATENT DOCUMENTS

| | | | |
|---|---|---|---|
| 3-149267 | 6/1991 | Japan | 430/287 |

*Primary Examiner*—Cynthia Hamilton
*Attorney, Agent, or Firm*—Beveridge, DeGrandi, Weilacher & Young, LLP

[57] ABSTRACT

A photopolymerizable resinous composition includes a photocurable prepolymer which is prepared by a three-step reaction. The first step of the reaction includes reacting epoxide compounds containing at least two epoxy groups with an unsaturated carboxylic acid containing at least three vinyl linkages and an unsaturated carboxylic acid containing one vinyl group. The second step includes reacting the reaction product formed from the first step in a reaction with polybasic acid anhydride, and a third step of reacting the reaction product formed from the second step with a monoepoxide containing one vinyl group. The composition further includes a photocurable monomer containing one carboxylic acid having at least three vinyl linkages, a photocurable monomer containing at least one vinyl group, a photopolymerization initiator, a curing agent, and organic solvents. The composition exhibits photo- and thermal-curability, and the ability to develop with a weak alkaline aqueous solution. A cured article is excellent in electroless gold plating resistance and fully satisfactory in adhesion soldering heat resistance.

12 Claims, No Drawings

PHOTOPOLYMERIZABLE RESINOUS COMPOSITION

FIELD OF THE INVENTION

This invention relates to a novel photocurable resinous composition, which can be used for forming a permanent protective mask, such as solder resist or the like, to be employed for the production of printed circuit boards (printed wiring boards), has high sensitivity and high resolution (line width 50 μm) and high speed curability to a ultraviolet irradiation, and forms by curing a dry film excellent in electroless gold plating resistance, soldering heat resistance, electrical characteristic and mechanical characteristics.

BACKGROUND OF THE INVENTION

A solder mask is usually employed before soldering the electronic devices to the printed wiring board, and is coated to form a film in all areas except where circuit conductors are soldered. This film is indispensable because it functions not only as an insulating membrane preventing the solder from adhering to necessary areas during the soldering, but also acts as a protective membrane preventing the circuit conductor from being corroded by oxidation after exposure to the air.

Hitherto, the solder mask have been formed on the board by screen printing and cured by ultraviolet rays or heat. However, not only has the printed board been steadily refined, enlarged and made into one-board, thus becoming more advanced with remarkable tempo, but also its mounting method have envolved into a surface mount technology (SMT), and therefore the solder mask is also required to be of higher resolution, accuracy and reliability to match the refined SMT. Various improvements in the solder mask have been proposed.

For example, a solder mask composition comprising bisphenol type epoxy acrylate, sensitizer, epoxy compound and epoxy curing agent, has been disclosed in Japanese Patent application No. 50-144431 and Japanese Patent No. 51-40451. In the case of these solder masks, the unexposed areas are removed and developed by an organic solvent. However, there are the risks of environmental pollution, fire and so on since a large amount of the organic solvents are used in the removal (development) of the unexposed areas.

In order to solve this problem, an alkali developing type photoimageable solder mask capable of development by a dilute alkali aqueous solution is proposed.

As for a photocurable composition capable of alkali development, a material consisting mainly of a reactive product as a base polymer, which is obtained by reacting epoxy resin with unsaturated monocarboxylic acid follow by adding polybasic acid anhydride is disclosed in Japanese Patent Publication No. 56-40329 and 57-45785. In addition, a liquid solder mask composition using a novolak type epoxy resin, which is superior in heat and chemical resistance, can be developed by a dilute alkali aqueous solution and is disclosed in Japanese Patent application No. 61-243869. And a photocurable resin comprising a reaction product (A) an epoxy vinyl ester resin obtained by reacting a cresol novolak epoxy resin and (B)an unsaturated monobasic acid and a polybasic acid anhydride and (C) an alkyl ketene dimer is disclosed in U.S. Pat. No. 4,933,259. And a photopolymerizable compound prepared by reacting a novolak type epoxy compound in successively, an unsaturated monocarboxylic acid dimer and a saturated or unsaturated polybasic acid anhydride is disclosed in U.S. Pat. No. 4,948,700. And a photopolymerizable composition comprising (D) a reaction product obtained by reacting epoxy resin (melting point 65°~90°) and an α,β-unsaturated carboxylic acid and then reacting with a polybasic acid anhydride is disclosed in U.S. Pat. No. 5,100,767.

However, the above mentioned solder mask composition have some problems after application. They include developing failure because of the advancement of heat curing electrolytic corrosion and discoloration of the surface of copper foil at the time of predrying depending on the combination of polybasic acid anhydride which is employed in order to make the mask soluble in the alkali developer, epoxy resin, and epoxy resin curing agent.

The composition also have the problem of deteriorating the electrical characteristics of the board due to the influence of carboxylic acid produced by the reaction of polybasic acid anhydride. In addition, their usage is restricted due to the compatibility between the carboxylic acid and epoxy resin, therefore the heat resistance and adhesion become worse.

However, with the recent advances of high density mounting, a reduction of the space between conductors have been required. Several demands have been imposed on electrical insulation between conductors, and excellent dimensional precision has been required of solder resist and the like. While the above mentioned photopolymerizable resinous compositions only have low resolving power to reach 150 μm to 300 μm, therefore the demand of high density mounting printed wiring board such as 80 μm to 150 μm has been unable to be satisfied by the compositions.

The purpose of the present invention is to eliminate the above problems of prior art and to provide a photopolymerizable composition useful as a liquid photoimageable solder mask which has superior ultraviolet curability, heat and chemical resistance, flexibility, electrical characteristics and which is possible to develop by a dilute alkali aqueous solution.

The above-described object is attained with a liquid light-sensitive resinous composition containing as main components (A) a photopolymerizable compound represented by the general formula [1] as follow: (which is a reaction product obtained by reacting epoxy resin. (a) containing at least two terminated epoxy groups and α,β-unsaturated carboxylic acid (b) containing at least three vinyl groups represented by the general formula [II] and an α,β-unsaturated carboxylic acid (c) and then reacting with polybasic acid anhydride (d) and then reacting with a monoepoxide (e) containing one vinyl group);

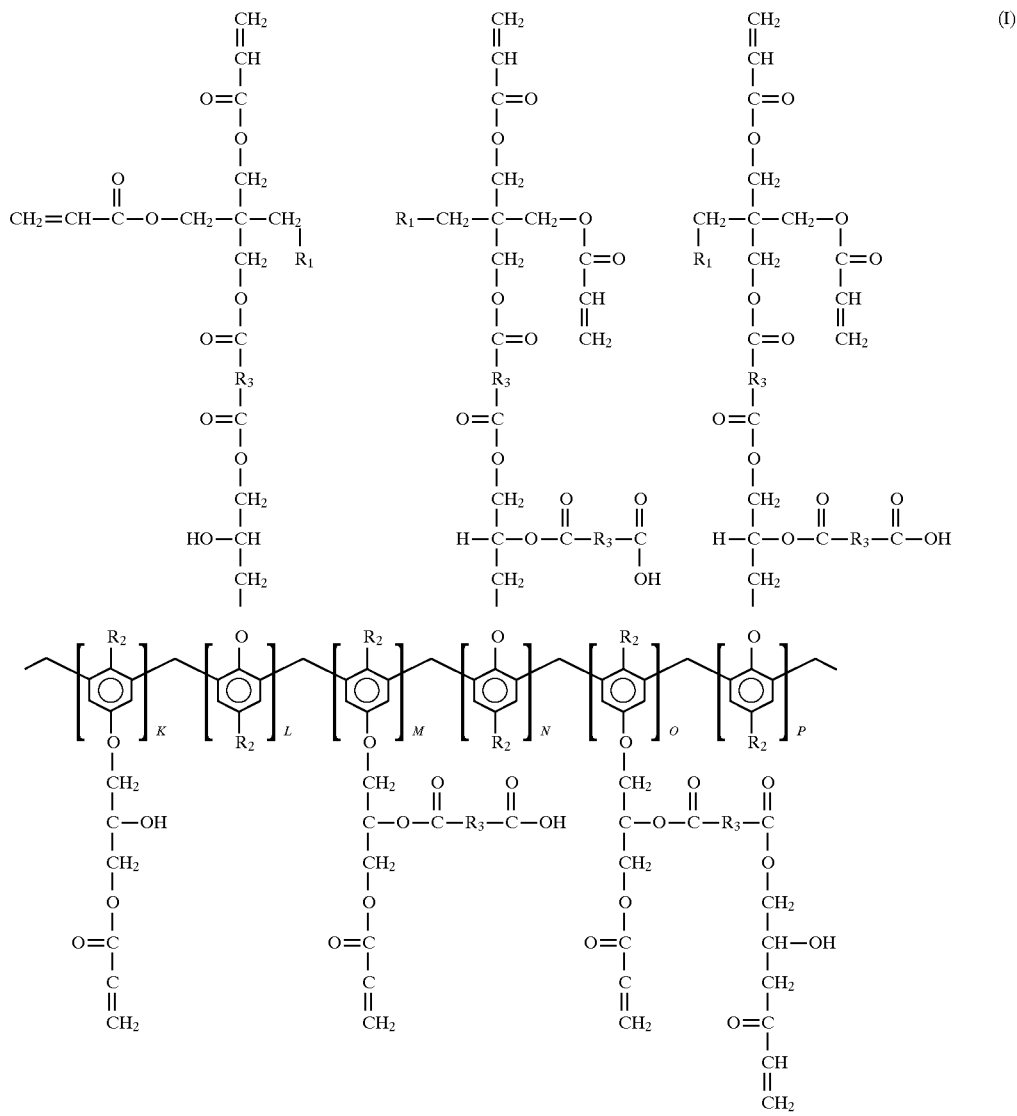

(B) a photocurable monomer containing carboxylic acid represented by the general formula [II]:

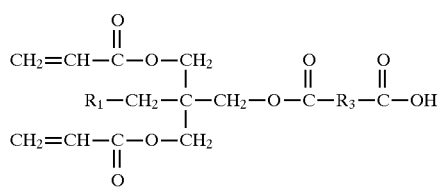

(C) a photocurable monomer containing at least one vinyl group;
(D) a photopolymerization initator;
(E) a curing agent which makes prepolymer (A) undergo thermal reaction;
(F) organic solvents.

DETAILED DESCRIPTION OF THE INVENTION

The characteristic of the invention is in the prepolymer (A) at least four vinyl group in a molecular unit comprising increase a liquid photoimageable solder mask photocure strength and resolution, shortening photo reaction time. In addition, the monomer (B) of the invention comprising hydrophilic carboxylic acid group increase the solubility difference between the exposed area and unexposed area. And it can increase the developability.

The liquid photocurable, prepolymer (A) of the invention represented by the general formula [I], which is a reaction product obtained by reacting epoxy resin (a) containing at least two terminated epoxy groups and an α,β-unsaturated carboxylic acid (b) containing at least three vinyl groups represented by the general formula [II] and an α,β-unsaturated carboxylic acid (c) and then reacting with polybasic acid anhydride (d) and then reacting with a monoepoxide (e) containing one vinyl group.

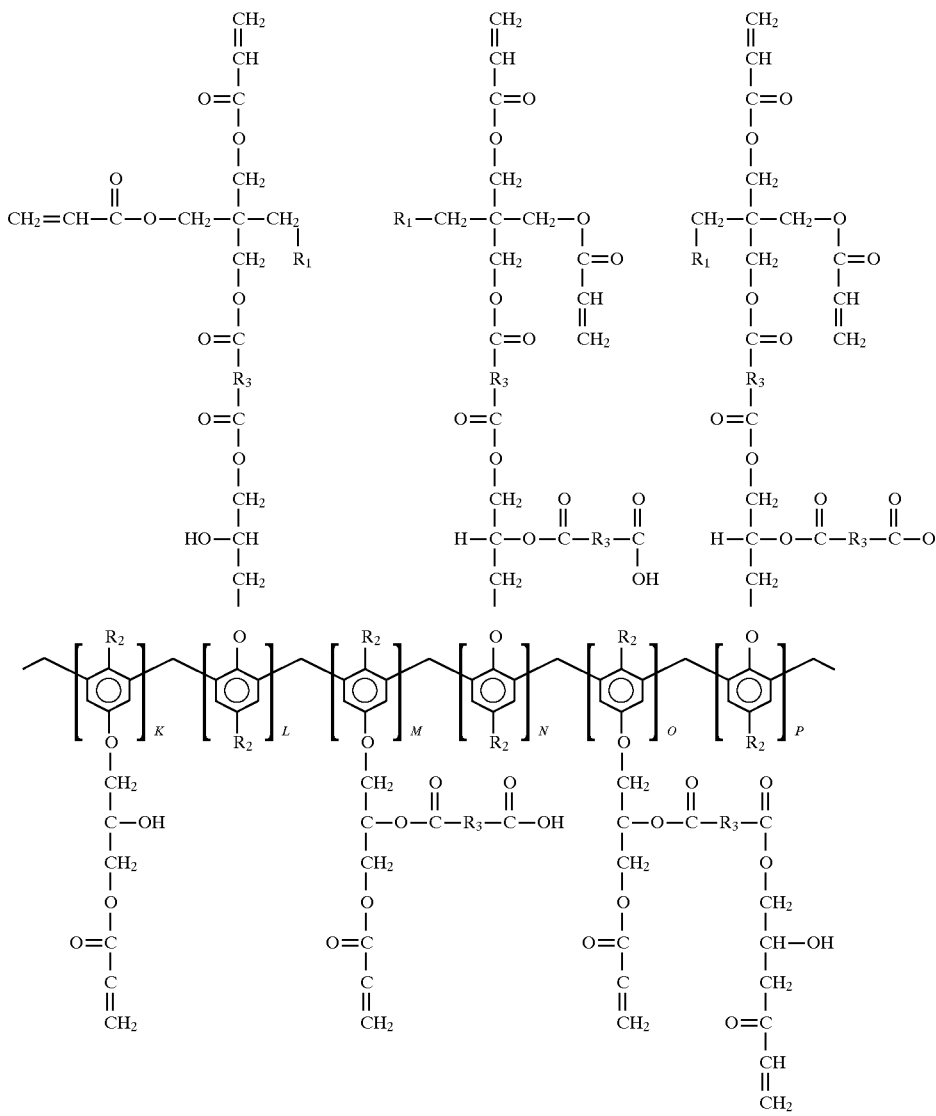

The representative of at least two epoxy compounds which can be used in this invention are phenol novolak type epoxy resins, cresol novolak type epoxy resins, and halogenated phenol novolak type epoxy resins, Bisphenol A type epoxy resin, Bisphenol F type epoxy resin, Bisphenol S type epoxy resin, triphenolmethyl epoxy resin, and Tetrabromo Bisphenol A type epoxy resins. Among these epoxy resins, phenol novolak type epoxy resins and cresol novolak type epoxy resin are preferred.

Compound (b) containing at least three vinyl groups represented by the general formula [II] is prepared by dipentaerythritol pentaacrylate or pentaerythritol triacrylate reacted with polybasic acid anhydride. Typical representive acid anhydride which can be used include succinic anhydride, methyl succinic anhydride, maleic anhydride, phthalic anhydride, tetrahydrophthalic anhydride, hexahydrophthalic anhydride, methyltetrahydrophthalic anhydride. The best product is that pentaerythritol triacrylate reacted with tetrahydrophthalic anhydride.

The forementioned unsaturated monocarboxylic acid (II) can't be bought by commercial market, it can be prepared by reacting dipentaerythritol pentaacrylate or pentaerythritol triacrylate with polybasic anhydride. In the successive reactions of a novolak type epoxy resin with these components for the production of a photopolymerizable compound, the proportion of the polybasic anhydride taking part in the reactions is 0.8 to 1.1 equivalent, preferably 0.9 to 1.0 equivalent, to 1 equivalent of hydroxyl groups of pentaerythritol acrylate. Suitable examples of a catalyst which can be used in this invention include triphenyl phosphine, triethylamine, methyl ethyl ammonium chloride and so on. Preferably triphenyl phosphine. The catalyst may be used preferably in an amount of 0.1 to 10 parts by weight. In order to prevent polymerization, add thermal polymerization inhibitor such as hydroquinone, methyl quinone preferably. The thermal polymerization inhibitor may be added preferably in an amount of 0.01 to 1 parts by weight, per 100 parts by weight of the reaction mixture.

The suitable reaction temperature and reaction time may be controlled between 80° and 120° C., 24 and 48 hours separately. Therefore the reaction product (formula 11) can be obtained, and its reaction formula can be shown as follows.

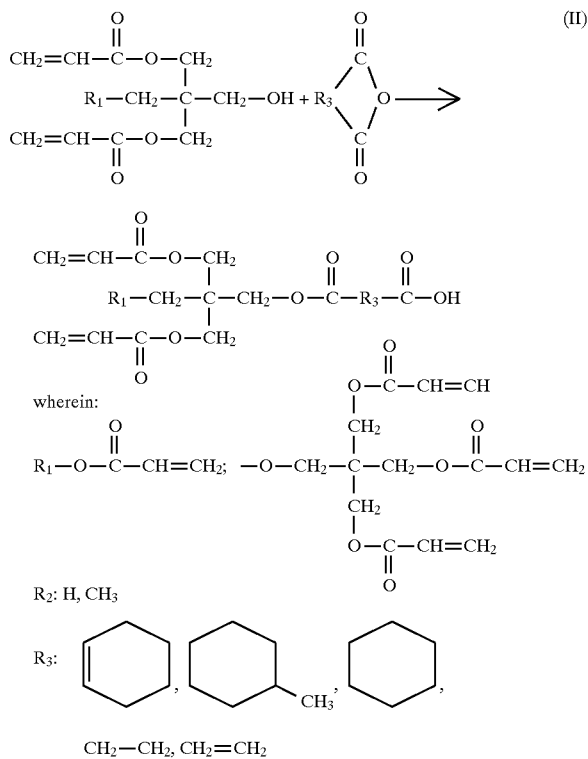

A α,β-unsaturated monocarboxylic acid containing at least one vinyl linkage can be included as: methacrylic acid, crotonic acid, cinnamic acid, and acrylic acid.

Saturated or unsaturated anhydride can be selected from succinic anhydride, hexahydrophthalic anhydride, methyhexahydrophthalic anhydride, tetrahydrophthalic anhydride, maleic anhydride.

A monoepoxide containing at least one vinyl linkage can be selected from glycidyl acrylate, glycidyl methacrylate.

The amount of monoepoxide (e) containing at least one vinyl linkage to the carboxylic group generated by above mentioned esterification is 0.1 mole~0.5 mole per chemical equivalent.

Above mentioned photopolymerizable prepolymer (A) can be prepared by reacting epoxide compound (a) containing at least two epoxy groups with an unsaturated carboxylic acid (b) containing at least three vinyl linkages and an unsaturated carboxylic acid (c) containing one vinyl group, then reacting with saturated or unsaturated polybasic anhydride (d), and reacting with a monoepoxide (e) containing at least one vinyl group in successively.

In the reaction the amount of each component composition one the ration of every component must be clear.

According to above mentioned discussion, the amount and ration of every component can get the best result in the region. In the reaction, epoxy compound (a) and a monocarboxylic acid (b) containing at least three vinyl linkages (formula II) the proportion of unsaturated monocarboxylic acid (b) containing at least three vinyl linkages taking part in the reactions is 0.1~0.5 mole, preferably 0.3 to 0.4 mole, to 1 equivalent of epoxy groups of epoxide compound. Suitable proportion of unsaturated carboxylic acid (c) containing one vinyl linkage taking part in the reactions is 0.5 to 0.9 mole, preferable 0.6 to 0.7 mole, to 1 equivalent of epoxy groups of epoxide compound. The proportion of polybasic acid anhydride (d) is 0.3 to 0.6 mole, preferably 0.4 to 0.5 mole, to 1 equivalent of hydroxyl group produced by reacting above mentioned acid with epoxide. The proportion of monoepoxide (e) containing at least one vinyl linkage is 0.1 to 0.5 mole, preferably 0.2 to 0.4 mole, to 1 equivalent of carboxylic acid group produced.

In other word, in photopolymerizable prepolymer (A) wherein (I,K,L,M,N,O,P) each represents the mole ratio of six components and it must be satisfied in the condition as follows:

$$K + L + M + N + O + P = 0.9~1.1$$
$$K + L = 0.4~0.7$$
$$M + N = 0.3~0.6$$
$$O + P = 0.03~0.3$$

The photopolymerizable prepolymer (A) in the invention can be used in an amount of 40 to 80 parts by weight, preferably 45 to 75 parts by weight of liquid photopolymerizable resinous composition.

The another characteristic of the invention is the photocurable monomer (B) containing one carboxylic acid group and at least three vinyl groups.

The photocurable monomer (B) comprising hydrophilic carboxylic acid group increases the solubility difference between exposed area and unexposed area. And it can increase the developability.

The other photocurable monomer (C) containing at least one vinyl group can select any known photocurable monomer containing at least one vinyl group. Typical examples of the monomer (C) are 2-hydroxy methacrylate, ethylene glycol monoacrylate, pentaerythritol triacrylate, dipentaerythritol pentaacrylate. The photocurable monomer (B) containing at least one carboxylic acid group and the other photocurable monomer (C) can be used by mixing.

The photocurable monomer (B) and the other photocurable monomer (C) can be used in an amount 10 to 70 parts by weight, preferably 20 to 60 parts by weight of liquid photopolymerizable resinous composition.

Photopolymerization initator include any known photopolymerization initator benzoin methyl ether, benzoin isopropyl ether, 2,2-dimethoxy-2-phenyl acetophenone, 1,1-dichloro-acetophenone, 1-hydroxycyclohexyl phenyl ketone, N,N-dimethyl aminoacetophenone, 2,4-dimethylthioxanthone, 2,4-di-ethylthioxanthone, 2-chlorothioxanthone, 2,4-diisopropylthioxanthone, acetophenone dimethyl ketal, benzyl dimethyl ketal, methyl benzophenone, 4,4'dichlorobenzophenone, 4,4'-bis-diethylaminobenzophenone, Michler's ketone and the like. It is most preferred to employ the combination of 2-methyl-1-[4-(methylthio)phenyl]-2-morpholino-propane-1-one, (manufactured by Ciba-Giegy) 2,4-diisopropylthioxanthone (manufactured by Nippon Kayaku Co. Ltd.).

The photopolymerization initator (D) can be used in an amount of 0.5 to 10 parts by weight, preferably 1 to 5 parts by weight of liquid photopolymerizable resinous composition.

Suitable curing agent (E) capable of making a prepolymer (A) undergo a thermal reaction include any known epoxy compound containing at least two epoxy group. Typical representative can be used include triglycidyl isocyanate, phenol novolak type epoxy resins, cresol novolak type epoxy resins, halogenated phenol novolak type epoxy resins, Bisphenol A type epoxy resins, Bisphenol F type epoxy resins, Bisphenol S type epoxy resins, triphenyl methane epoxy resins, or tetrabromo Bisphenol A epoxy resins, etc.

The curing agent (E) can be used in an amount of 0.1 to 15 parts by weight, preferably 0.5 to 5 parts by weight of liquid photopolymerizable resinous composition.

As for the organic solvent (F) used as diluent in this invention, may be used alone or as a mixture of two or more to dissolve the above mentioned composition. Suitable examples of an organic solvent (F) which can be used in this invention include propylene carbonate, butyl cellosolve, butyl cellosolve acetate, toluene, xylene, carbitol acetate, cyclohexane, propylene glycol monomethyl ether, dipropylene glycol diethyl ether and so on. Preferable examples can be propylene carbonate and butyl cellosolve acetate.

The organic solvent (F) in this invention can be used in an amount of 5~60 parts by weight, preferably 10 to 50 parts by weight of liquid photopolymerizable resinous composition.

Major filler used in this invention include inorganic filler talc, silica, alumina, calcium carbonate, clay, aerosol and so on.

The inorganic filler in this invention can be used in amount of 20 to 40 parts by weight, preferably 25 to 35 parts by weight of liquid photopolymerizable resinous composition.

EXAMPLE

Now, the invention will be described more specifically below with reference to working examples and comparative experiments. It should be noted, however, that the present invention is not limited by these examples. Wherever "parts" and "%" are mentioned, they are invariably used on weights unless otherwise specified.

[Preparation example of unsaturated monocarboxylic acid compound (formula):]

Preparation Example 1

524 parts (1 equivalent) dipentaerythritol pentaacrylate and 152 parts (1 mole) tetrahydrophthalic anhydride, 0.6 parts hydroquinone, 2.6 parts triphenylphosphine provided to reactor, stirred at a temperature in the range 80° C. melted reaction mixture for an hours was heated to a temperature at 105° C. and stirred for reaction for 32 hours. The reaction mixture was removed from the flask and left cooling to normal room temperature to obtain product (II-1) having an acid value 83 mg KOH/g.

Preparation Example 2

Follow the product of Preparation Example 1, excepting the dipentaerythritol pentaacrylate instead of 292 parts of pentaerythritol triacrylate. The obtained product (II-2) having an acid value 126 mg KOH/g.

[Preparation example of photopolymerizable compound (A)]

Preparation Example 3

210 parts (1 equivalent) of a cresol novolak type epoxy resin having an epoxy equivalent of 210 (product of Tohto Kasei Co., Ltd. Under registered trademark designation of "EPO Tohto" YDCN-704) was melted and stirred at a temperature in a range of 90° C. to 100° C. Then 338 parts (0.5 mole) unsaturated monocarboxylic acid compound (II-1) and 36 parts (0.5 mole) of acrylic acid, 0.72 parts of hydroquinone, 195 parts of propylene carbonate and 195 parts of carbitol acetate were added to the stirred molten resin and 1.05 parts triphenyl phosphine was added. The resultant mixture was heated to a temperature in the range of 110° C. and stirred for reaction 24 hours to obtain an esterification product having an acid value of 3 mg KOH/g, then adding 152 parts of tetrahydrophthalic anhydride was heated to a temperature in the range of 100° C. to 105° C. and stirred for reaction 5 hours, and adding 64 parts of glycidyl acrylate stirred for 3 hours to obtain an product having acid value 54 mgKOH/g (A-1), solid content 65%.

Preparation example 4

210 parts (1 equivalent) of a cresol novolak type epoxy resin having an epoxy equivalent of 210 (product of Tohoto Kasei Co., Ltd. Under registered trademark designation of "Epo Tohto" YDCN-704 was melted and stirred at a temperature in a range of 90° C. to 100° C. then 196.8 parts of unsaturated monocarboxylic acid compound (II-2), 36 parts of acrylic acid, 0.36 parts of hydroquinone, 140 parts of propylene carbonate and 140 parts carbitol acetate were added to the stirred molten resin then 0.85 parts triphenyl phosphine was added. The resultant mixture was heated to a temperature in the range of 110° C. to 115° C., and stirred for 24 hours to obtain an esterification procuct having an acid value of 3 mg KOH/g. Then adding 52 parts of tetrahydrophthalic anhydride which was heated to a temperature in the range of 100° C. to 105° C. and stirred for reaction 5 hours, and adding 64 parts of glycidyl acrylate stirred for 3 hours to obtain an product having acid value 54 mg KOH/g, solid content 65% (A-2)

[Preparation Example or comparative polymerization compound (A')]

Preparation Example 5

210 parts (1 equivalent) of a cresol novolak type epoxy resin having an epoxy equivalent of 210 (product of Tohto Kasei Co., Ltd. Under registered trademark designation of "Epo Tohto" YDCN-704), 13.4 parts (0.1 mole) of the dihydro-xymethyl propanic acid, and 64.85 parts (0.9 mole) of acrylic acid, 0.46 parts of hydroquinine, and 161.59 parts of carbitol acetate were melted and stirred at a temperature in the range of 90° C. to 95° C. Then reaction mixture cooled to 60° C. and adding 1.38 parts of tri-phenylphosphine, and stirred for reaction 32 hours in the range of 100° C. to 115° C. to obtain a reaction product having acid value 0.5 mg KOH/g.(hydroxy value: 1.2 equivalent). Then adding 36.47 parts (0.24 mole) of tetrahydrophthalic anhydride, 19.63 parts of carbitol acetate to the reaction mixture and stirred for reaction 6 hours in the range of 95° C. to 100° C. to obtain an reaction product (A'-1) having an acid value 40 mg KOH/g, solid content 65%.

Preparation Example 6

210 parts of (1 equivalent) of a cresol monolak type epoxy resin having an epoxy equivalent of 210 (product of Tohto Kasei Co., Ltd. Under registered trademark designation of "Epo Tohto" YDCN-704), 72 parts (1 mole) of acrylic acid, 0.46 parts of hydroquinone and 161.59 parts of carbitol acetate were melted and stirred at a temperature in a range of 90° C. to 100° C. then the reaction mixtures were cooled to 60° C., and added 1.38 parts of triphenylphosphine kept at a temperature in the range of 100° C. to 105° C. and stirred for reaction 12 hours to obtain an esterification product having acid value 0.5 mg KOH/g, then adding 76 parts (0.5 mole) of tetra-hydrophthalic anhydride and 19.63 parts of carbitol acetate to the reaction mixture, were kept at an temperature in the range of 95° C. to 100° C. and stirred for reaction 6 hours to obtain an reaction product (A'-2) having an acid value 40 mg KOH/g and solid content 65%.

Preparation Example 7

215 parts(1 equivalent) of a cresol novolak type epoxy resin (softening point: 74°–83° C., epoxy equivalent:215), 72 parts of acrylic acid, 0.46 parts of hydroquinone, and 155.6 parts of butyl cellosolve acetate were melted and stirred at a temperature in a range of 90° C. to 95° C. Then the reaction mixtures were cooled to 60° C. and add 1.38 parts of triphenyphosphine and heated to a temperature in the range of 100° C. to 105° C., and stirred for reaction 8 hours to obtain an esterification product having an acid value 3 mg KOH/g. Then adding 76 parts (0.5 mole) of tetrahydrophthalic anhydride heated to a temperature in the range of 95° C. to 100° C. and stirred for reaction 6 hour to obtain a reaction product (A'-3) having acid value 54 mg KOH/g and solid content 65%.

Preparation Example 8

100 parts (0.47 equivalent) of cresol novolak type epoxy resin (softening point:85° C., epoxy equivalent:212), 71.3 parts (0.49 mole) of acrylic acid dimer, 0.46 parts of hydroquinone, and 103.6 parts of carbitol acetate were melted and stirred at a temperature in a range of 90° C. to 95° C. Then the reaction mixture were cooled to 60° C. and added 1.38 parts of triphenylphosphine and heated to a temperature in the range of 100° C. to 105° C., and stirred for reaction 8 hours to obtain an esterification product having acid value 3 mg KOH/g. Then adding 70.4 parts (0.46 mole) of tetrahydrophthalic anhydride heated to a temperature in the range of 95° C. to 100° C. and stirred for reaction 6 hours to obtain a reaction product (A'-4) having acid value 54 mg KOH/g, solid content 70%.

Preparation Example 9

215 parts (1 equivalent) of cresol novolak type epoxy resin (softening point :85° C., epoxy equivalent: 215), 72 parts (1 mole) of acrylic acid, 0.5 parts of hydroquinone, 103.6 parts of carbitol acetate were melted and stirred at a temperature in a range of 90° C. to 95° C. Then the reaction mixtures were cooled to 60° C. and added 1.38 parts of triphenylphosphine and heated to a temperature in the range of 100° C. to 105° C., and stirred for reaction 8 hours to obtain an esterification product having an acid value 3 mg KOH/g. Then adding 116 parts (0.75 mole) of hexahydrophthalic anhydride heated to a temperature 95° C. and stirred for reaction 6 hours cooled to 50° C. to obtain an intermediate having an acid value 72 mg KOH/go solid content 70%, then adding 22 parts of ketene (0.26 mole), temperature kept at 50° C. for 30 minutes, then reacting at 80° C. for 1.5 hrs to obtain a compound (A'-5) having a acid value 70 mg KOH/g.

[Example]

The components indicated below were premixed in the proportions indicated correspondingly and the premix was kneaded three times with a three-roll mill to produce a photosensitive thermosetting resin composition. By a test with a grind meter (produced by Toyo Seiki Seisakusho Co., Ltd.), this composition was found to possess a particle size of not more than 5 μm.

This photosensitive thermosetting resin was applied by the screen printing method on the entire surface of a copper throughhole printed circuit board. Then, a photomask having a pre-determined pattern was set as opposed to the coated surface.

The coating of the composition was then exposed through the photomask to a light from collimating ultra-high-pressure mercury-vapor-lamp exposure device (product of ORC manufacture Co., Ltd.). The exposed coating was developed with 1% sodium carbonate applied as developing solution by spraying under a pressure of 2.0 kg/cm$^2$. It was placed in a hot air circulation oven kept at a temperature of 150° C., and post cured for 60 minutes, to form a solder resist pattern.

TABLE 1

| Example | The component of example | | | | | | | |
|---|---|---|---|---|---|---|---|---|
| | 1 | 2 | 3 | 4 | 5 | 6 | 7 | 8 |
| (A) component | | | | | | | | |
| (A-1) | 48 | 48 | 48 | | | | 24 | 24 |
| (A-2) | | | | 48 | 48 | 48 | 24 | 24 |
| (B) component | | | | | | | | |
| Iragacure 907 | 5 | 5 | 5 | 5 | 5 | 5 | 5 | 5 |
| Kayacure ITX | 0.25 | 0.25 | 0.25 | 0.25 | 0.25 | 0.25 | 0.25 | 0.25 |
| (C) component | | | | | | | | |
| photopolymerizable monomer (II-1) | 6 | 6 | | | 6 | 6 | | |
| photopolymerizable monomer (II-2) | | | 6 | 6 | | | 6 | 6 |
| (D) component | | | | | | | | |
| pentaerythritol triacrylate | 1 | 1 | 1 | 1 | 1 | 1 | 1 | 1 |
| dipentaerythritol pentacrylate | 1 | 1 | 1 | 1 | 1 | 1 | 1 | 1 |
| (E) component | | | | | | | | |
| NPCN-704* | 6.25 | 6.25 | 6.25 | 6.25 | 6.25 | 6.25 | 6.25 | 6.25 |
| (F) component | | | | | | | | |
| propylene carbonate | 6.25 | 6.25 | 6.25 | 6.25 | 6.25 | 6.25 | 6.25 | 6.25 |
| carbitol acetate | 6.25 | 6.25 | 6.25 | 6.25 | 6.25 | 6.25 | 6.25 | 6.25 |
| The other composition | | | | | | | | |
| barium sulfate | 6.5 | 6.5 | 6.5 | 6.5 | 6.5 | 6.5 | 6.5 | 6.5 |
| silica | 11 | 11 | 11 | 11 | 11 | 11 | 11 | 11 |

TABLE 1-continued

| | The component of example | | | | | | | |
|---|---|---|---|---|---|---|---|---|
| Example | 1 | 2 | 3 | 4 | 5 | 6 | 7 | 8 |
| phthalocyanine green | 0.5 | 0.5 | 0.5 | 0.5 | 0.5 | 0.5 | 0.5 | 0.5 |
| KS-66 (anti foaming agent) | 1 | 1 | 1 | 1 | 1 | 1 | 1 | 1 |
| Total | 100 | 100 | 100 | 100 | 100 | 100 | 100 | 100 |

Irgacure 907: Ciba Geigy produced photoinitator, 2-methyl-1-[4-(methylthio) phenyl]-2-morpholino-1-propanone
Kayacure ITX: Nippon Kayaku Co., Ltd. Produced photoinitator, isopropyl-9-oxo-thioxanthone
Kayacure DETX: Nippon Kayaku Co., Ltd. Produced photoinitator, 2,4-diethyl9-oxo-thioxanthone
*NPCN-704: the epoxy resin manufactured by Nan Ya plastic Co.

TABLE 2

| | The composition of comparative | | | | | | | |
|---|---|---|---|---|---|---|---|---|
| Comparative Example | 1 | 2 | 3 | 4 | 5 | 6 | 7 | 8 |
| (A) component | | | | | | | | |
| (A'-1) | 48 | | | | | | | |
| (A'-2) | | 48 | 30 | 40 | 45 | | | |
| (A'-3) | | | | | | 60 | | |
| (A'-4) | | | | | | | 50 | |
| (A'-5) | | | | | | | | 46 |
| (B) component | | | | | | | | |
| Irgacure 907 | 3.75 | 3.75 | 4 | 3.5 | 5.0 | 4 | 3.43 | 7.2 |
| Kayacure DETX | 0.16 | 0.16 | 1.5 | 2.5 | 3.5 | | | 4.8 |
| diethylaminobenzophenone | | | | | | 0.5 | | 1.8 |
| (D) component | | | | | | | | |
| dipentaerythritol hexaacrylate | 6.25 | 6.25 | 9 | | | | 5.14 | |
| dipentaerythritol pentaacrylate | 5.02 | 5.02 | | 5.5 | 5 | | | |
| trimethyl propane triacrylate | | | | | | 2 | | 4 |
| (E) component | | | | | | | | |
| 2P4MHZ | | | 1.5 | 2.0 | | | 1.43 | |
| dicyandiamide | 0.31 | 0.31 | | | | | | 1.0 |
| melamine | | | | | 1.0 | 1 | | |
| (F) component | | | | | | | | |
| butyl cellosolve acetate | 4.69 | 4.69 | 2 | | 5 | 11 | | |
| carbtiol acetate | 4.69 | 4.69 | 10 | | 2 | | | |
| ethyl cellosolve acetate | | | 10 | 23 | | | 7.14 | 10.5 |
| The other composition | | | | | | | | |
| Talc | | | 5 | 8 | 5 | | 2 | |
| Barium Sulfate | 16.16 | 16.16 | 10 | 1.0 | 9.5 | | 12.15 | |
| Calcium Carbonate | 1.56 | 1.56 | 8.5 | | 5 | 10 | 1.71 | 13.7 |
| Silica | 1 | 1 | | 1 | | 1 | 1 | |
| phthalocyanine | 0.5 | 0.5 | 0.5 | 0.5 | 0.5 | 0.5 | 1.0 | 1.0 |
| Triglycidyl isocyanurate | 6.25 | 6.25 | 4 | 10 | | 9 | 14 | |
| KS-66 (antifoaming agent) | 0.1 | 0.1 | 1 | 1 | 1 | 1 | 1 | 1 |
| NPEL-128 | 1.56 | 1.56 | 3.0 | | 12.5 | | | 10 |
| (Nan Ya Co., Ltd. Produced) | | | | | | | | |
| Total | 100 | 100 | 100 | 100 | 100 | 100 | 100 | 100 |

[Experiment]

In the example 1 to 8 and comparative 1 to 8, examples before development take a tackiness after drying test, example before thermocurable take developability test. Photosensitivity test. Example after thermocure take adhesion test, solder heat resistance test, base resistance test and solvent resistance test.

1. Tackiness after drying

The tackiness of the predried coating film was measured by finger touch and evaluated using the following criteria:
   ○: No tackiness at all.
   Δ: A little tackiness was felt, but there was no trace of a finger print.
   X: A trace of a finger print were left on the coating film.

2. Developability

The developing property was determined by exposing a sample through a relevant photomask to an ultra-violet light 365 nm in wavelength to a dosage of 750 mJ/cm$^2$ with the aid of an integral antinometer (product of ORC Manufacturing Co., Ltd.) thereby producing a test piece, developing the test piece for 60 seconds with a relevant developing solution applied by spraying under a pressure of 2 kg/cm$^2$, and visually rating the condition of removal of the unexposed part of the coating on the following four-point scale.

◎ : Perfect development
○: Survival of thin undeveloped surface portion
Δ: Survival of undeveloped portion throughout the entire surface
X : Substantial absence of development 3. Adhesion One hundred cross-cuts(10×10) were made on the coated film and the peeling test (according to JIS D0202) was performed using a cellophane tape (peeling after sticking the cellophane tape onto the coated film). The peeling of the cross-cut is evaluated by the criteria.

◎ : Total absence of peeling (100/100)
○: Slight peeling in cross-cut portions (100/100)
Δ: 50/100 to 90/100
X : 0/100 to 50/100

4. Solder Heat Resistance

The peeling test (according to JIS C6481) was performed using cellophane tape after dipping the sample in a solder bath at 260° C. for 10 seconds. A single test was defined as one cycle, and the solder heat resistance was evaluated by the following criteria after one cycle.

○: No abnormality in the coated film
Δ: Slight bulging or blistering on the coated film
X : Bulging or blistering on the coated film 5. Electroless Plating Resistance First, the test piece is immersed in the acid degrease liquid for 3 minutes at 30° C. to be degreased. Then, immersed in water for 3 minutes to be cleaned. Second, the test piece will be immersed in the water containing 14.3% $(NH_4)_2SO_4$ for 3 minutes to do soft etching. Then cleaning in water for 3 minutes. At room temperature, immersing in the water containing 10 vol % $H_2SO_4$ for 1 minute, then in water for 30 seconds to 1 minutes to clean the test piece. After that, at 30° C., immersing in activation liquid for 7 minutes then test piece to be activated. Follow this, immersing in water for 3 minutes to clean the activated test piece then doing the nickle plating by immersing in nickle plating bath for 20 minutes at 85° C. At room temperature, for immersing in 10% vol sulfuric acid solution for 1 minute, rinsing the test piece by running water for 3 minutes, then subjecting to the gold plating by immersing in gold plating bath 10 minutes at 95° C. Next, clean it by immersing on running water for 3 minutes, and in hot water for 3 minutes at 60° C. to clean. Completely, after fully dry can get the gold plated test piece. Then doing the peeling test with cellophane tape on the test piece to evaluate the peeling condition of protective mask.

○: No abnormality in the coated film
Δ: Slight bulging or blistering on the coated film
X : Bulging or blistering on the coated film 6. Evaluation of Sensitivity A step wedge having a difference of 0.15 (expressed in terms of Δlog E) in density level was brought into contact with each dry film, exposed under illuminance of 1,000 mJ/cm² by means of a 5 Kw ultra high pressure mercury lamp, and then developed for twice as long as the time at which the unexposed dry film was dissolved to obtain a negative image corresponding to the wedge. Thus, the step number at which the corresponding part of the dry film was thoroughly elluted (clear step number) was examined. A higher step number corresponds to a higher sensitivity.

7. Evaluation of Pencil Hardness

The pencil hardness of the coated film is evaluated according to JIS K 5400 6-14 under a fixed load of 1 kg.

8. Evaluation of Acid Resistance

Exposure, development and after-curing processing were carried out in the same manner as in the evaluation of adhesion, and each sample was soaked for 30 minutes at 20° C. in a 10 vol % aqueous solution of sulfuric acid. Then, the condition and the adhesiveness of the resulting film were judged collectively.

◎ : Total absence of change
○: Very slight perceivable change
Δ: Peeling on not more than 10% of coated surface
X : Peeling on entire coated surface 9. Evaluation of Base Resistance Exposure, development and after-curing processing were carried out in the same manner as in the evaluation of adhesion, and each sample was soaked for 30 minutes at 20 in a 10 weight % aqueous solution of sodium hydroxide. Then, the condition and the adhessiveness of the resulting film were judged collectively.

◎ : Total absence of change
○: Very slight perceivable change
Δ: Peeling on not more than 10% of coated surface
X : Peeling on entire coated surface 10. Solvent Resistance Exposure, development and after-curing processing were carried out in the same manner as in the evaluation of adhesion, and each sample was soaked for 30 minutes at 20° C., in trichloromethane and acetone. Then, the condition and the adhessiveness of the resulting film were judged collectively.

◎ : Total absence of change
○: Very slight perceivable change
Δ: Peeling on not more than 10% of coated surface
X : Peeling on entire coated surface 11. Resolution Exposure, development and after curing processing were carried out in the same manner as in the evaluation of adhesion.

The resulting resist pattern was observed by means of a micro-scope (×100) to judge a line width of the maskpattern formed separately by each resist. The smaller the resolution value, the higher the resolution power of the photoresist, therefore the photomask can be widely applied.

TABLE 3

Coating properties comparison of example, comparative example

| | 1 | 2 | 3 | 4 | 5 | 6 | 7 | 8 |
|---|---|---|---|---|---|---|---|---|
| Example | | | | | | | | |
| Tackiness after drying | ○ | ○ | ○ | ○ | ○ | ○ | ○ | ○ |
| Developability | ◎ | ◎ | ◎ | ◎ | ◎ | ◎ | ◎ | ◎ |
| Adhesion | ◎ | ○ | ◎ | ◎ | ○ | ◎ | ◎ | ○ |
| Solder Heat Resistance | ○ | ○ | ○ | ○ | ○ | ○ | ○ | ○ |
| Electroless Plating | ○ | ○ | ○ | ○ | ○ | ○ | ○ | ○ |

TABLE 3-continued

Coating properties comparison of example, comparative example

| | 1 | 2 | 3 | 4 | 5 | 6 | 7 | 8 |
|---|---|---|---|---|---|---|---|---|
| Resistance to Solvent | ⊚ | ⊚ | ⊚ | ⊚ | ⊚ | ⊚ | ⊚ | ⊚ |
| Acid Resistance | ⊚ | ⊚ | ⊚ | ⊚ | ⊚ | ⊚ | ⊚ | ⊚ |
| Base Resistance | ⊚ | ⊚ | ⊚ | ⊚ | ⊚ | ⊚ | ⊚ | ⊚ |
| Pencil Hardness | 6H | 6H | 6H | 6H | 6H | 6H | 6H | 6H |
| Sensitivity | 13 | 12 | 13 | 14 | 13 | 12 | 14 | 13 |
| Resolution | 50 μm | 50 μm | 50 μm | 50 μm | 50 μm | 50 μm | 50 μm | 50 μm |
| Comparative Example | | | | | | | | |
| Tackiness after Drying | ○ | ○ | ○ | ○ | ○ | ○ | ○ | ○ |
| Developability | ○ | Δ | ○ | Δ | Δ | ○ | ○ | ○ |
| Adhesion | ○ | ⊚ | ○ | ⊚ | ○ | ⊚ | ○ | ○ |
| Solder Heat Resistance | Δ | ○ | Δ | ○ | ○ | Δ | ○ | ○ |
| Electroness plating | Δ | ○ | ○ | Δ | ○ | ○ | Δ | Δ |
| Resistance to Solvent | ⊚ | ⊚ | ⊚ | ⊚ | ⊚ | ⊚ | ⊚ | ⊚ |
| Acid Resistance | ⊚ | ⊚ | ⊚ | ⊚ | ⊚ | ⊚ | ⊚ | ⊚ |
| Base Resistance | ⊚ | ⊚ | ⊚ | ⊚ | ⊚ | ⊚ | ⊚ | ⊚ |
| Pencil Hardness | 6H | 5H | 5H | 6H | 6H | 5H | 6H | 5H |
| Sensitivity | 10 | 11 | 10 | 11 | 11 | 10 | 11 | 10 |
| Resolution | 150 μm | 200 μm | 200 μm | 200 μm | 100 μm | 300 μm | 200 μm | 250 μm |

EFFECTS OF THE INVENTION

From the result, carboxylic acid containing photocurable monomer (II) and photocurable prepolymer (A) in the invention play very important roles. The composition of this invention can be developed by a dilute alkali aqueous solution due to the carboxylic group in carboxylic acid containing photocurable monomer (II) make a large differences in compatibility of dilute alkali aqueous solution between exposed and unexposed area.

Photocurable prepolymer (A) of this invention can provide a film excellent in sensitivity and solder heat resistance, electroless plating resistance, and also provide a film of higher resolution.

What is claimed is:

1. A photopolymerizable resinous composition comprising a photocurable prepolymer having the formula I

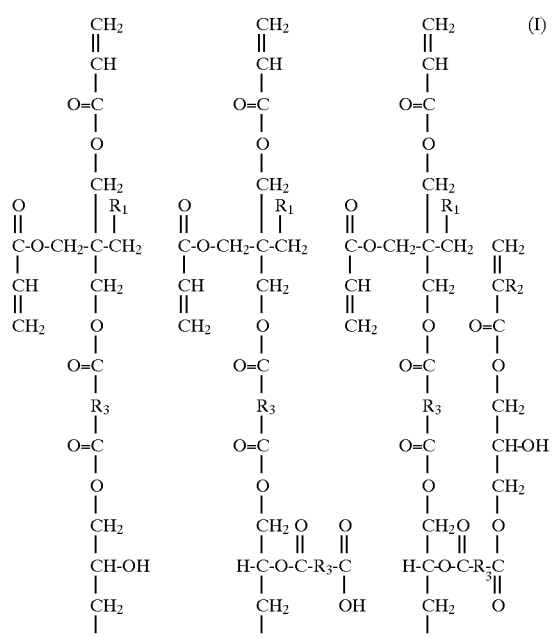

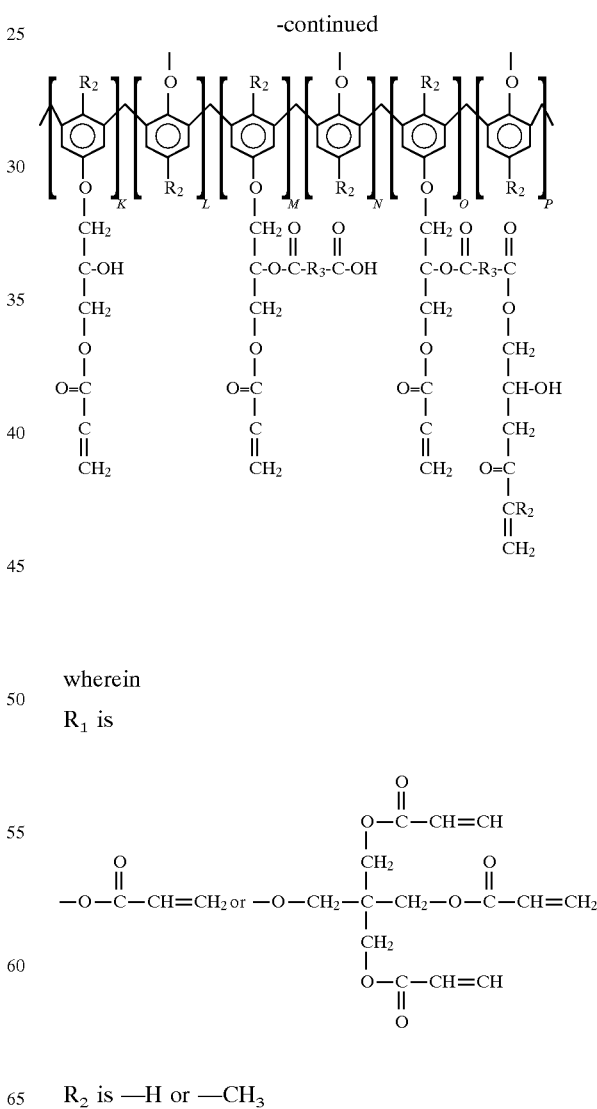

wherein $R_1$ is $R_2$ is —H or —$CH_3$ $R_3$ is

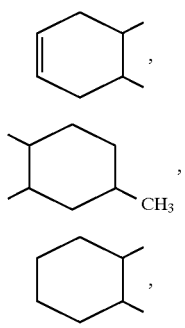

—CH$_2$—CH$_2$—, and —CH=CH—, wherein K, L, M, N, O, and P in the formula I, are each mole ratios which satisfy as a group the following conditions:

$K+L+M+N+O+P=0.9-1.1$;

$K+L=0.4-0.7$;

$M+N=0.3-0.6$;

$O+P=0.03-0.3$ wherein said photocurable prepolymer is prepared by the process comprising reacting at least one epoxide compound containing at least two epoxy groups with a first unsaturated carboxylic acid containing at least three vinyl linkages having the formula II

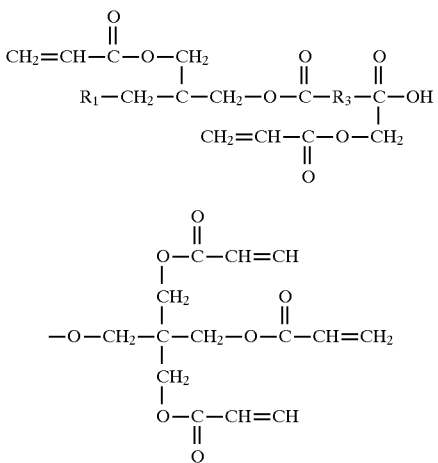

wherein $R_1$ is

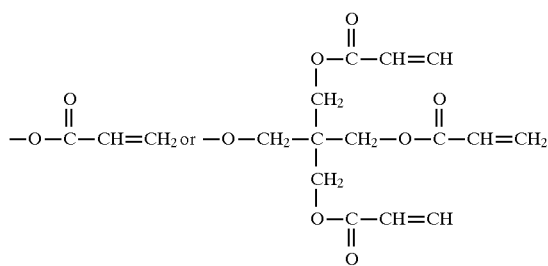

$R_3$ is

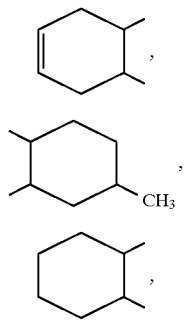

—CH$_2$—CH$_2$—, and —CH=CH—, with a second unsaturated carboxylic acid to form a first reaction product, then reacting said first reaction product with a polybasic acid anhydride to form a second reaction product, then reacting said second reaction product with a monoepoxide containing one vinyl group to form said photocurable prepolymer, wherein said photocurable prepolymer is present in an amount of 40–80 weight percent of said photopolymerizable resinous composition;

a first photocurable monomer containing one carboxylic acid having the formula II present in an amount of 10–40% by weight of said photopolymerizable resinous composition;

a second photocurable monomer containing at least one vinyl group present in an amount of 10–30% by weight of said photopolymerizable resinous composition;

a photopolymerization initiator present in an amount of 0.5–10% by weight of said photopolymerizable resinous composition;

a curing agent present in an amount of 0.1–15% by weight of said photopolymerizable resinous composition; and at least one organic solvent present in an amount of 5–60% by weight of said photopolymerizable resinous composition.

2. The photopolymerizable resinous composition as defined in claim 1 wherein a proportion of said first unsaturated carboxylic acid is 0.1 to 0.5 moles, to 1 equivalent of an epoxy group of said epoxide compound, and wherein a proportion of said second carboxylic acid is 0.5 to 0.9 moles, to 1 equivalent of an epoxy group of said epoxide compound, wherein a proportion of said polybasic acid anhydride is 0.3 to 0.6 moles, to 1 equivalent of a hydroxyl group produced by reacting the epoxide, and wherein a proportion of said monoepoxide is 0.1 to 0.5 moles, to 1 equivalent of a carboxylic acid group produced.

3. The photopolymerizable resinous composition as defined in claim 2 wherein the proportion of said first unsaturated carboxylic acid is 0.3 to 0.4 moles, to 1 equivalent of an epoxy group of said epoxide compound and wherein the proportion of said second carboxylic acid is 0.6 to 0.7 mole, to 1 equivalent of an epoxy group of said epoxide compound wherein the proportion of said polybasic acid anhydride is 0.4 to 0.5 moles, to 1 equivalent of a hydroxyl group produced by reacting said epoxide compound, and wherein the proportion of said monoepoxide is 0.2 to 0.3 moles, to 1 equivalent of a carboxylic acid group produced.

4. The photopolymerizable resinous composition as defined in claim 1, wherein said epoxide compound comprises at least one compound selected from the group consisting of phenol novolak epoxy resin and cresol novolak epoxy resin;

said second unsaturated carboxylic acid comprises at least one compound selected from the group consisting of acrylic acid, methacrylic acid, crotonic acid and cinnamic acid;

said polybasic acid anhydride comprises at least one compound selected from the group consisting of succinic anhydride hexahydrophthalic anhydride, methyl hexahydrophthalic anhydride, tetrahydrophthalic anhydride and maleic anhydride; and said monoepoxide comprises at least one compound selected from the group consisting of glycidyl acrylate and glycidyl methacrylate.

5. The photopolymerizable resinous composition as defined in claim 1 wherein said first unsaturated carboxylic acid and said photocurable monomer are prepared by the reaction of pentaerythritol acrylate with polybasic acid anhydride, wherein a proportion of polybasic acid anhydride is 0.8 to 1.1 moles, to 1 equivalent of hydroxyl groups of said pentaerythritol acrylate.

6. The photopolymerizable resinous compound as defined in claim 5 wherein the preparation of polybasic acid anhydride is 0.9 to 1.0, to 1 equivalent of hydroxyl groups of said pentaerythritol acrylate.

7. The photopolymerizable resinous composition as defined in claim 5 wherein said pentaerythritol acrylate comprises at least one compound selected from the group consisting of dipentaerythritol pentaacrylate and pentaerythritol triacrylates; and wherein said polybasic acid anhydride comprises at least one compound selected from the group consisting of succinic anhydride, hexahydrophthalic anhydride, methylhexahydrophthalic anhydride, tetrahydrophthalic anhydride, and maleic anhydride.

8. The photopolymerizable resinous composition as defined in claim 1 wherein said second photocurable monomer comprises at least one compound from the group consisting of 2-hydroxyethyl methacrylate, dipentaerythritol pentaacrylate, dipentaerythritol hexaacrylatee, and pentaerythritol triacrylate.

9. The process for producing the photopolymerizable resinous composition defined in claim 1 comprising kneading said photocurable prepolymer, said first photocurable monomer, said second photocurable monomer, said photopolymerization initiator, said curing agent, and said at least one organic solvent to form said photopolymerizable resinous composition.

10. A process for producing a solder resist pattern comprising applying said photopolymerizable resinous composition as defined in claim 1 to a surface of a copper throughhole printed circuit board to form a coated surface;

masking said coated surface with a photomask, exposing said composition through said photomask to ultraviolet light, developing said exposed coated surface with sodium carbonate solution, and curing said developed coated surface to form a solder resist pattern.

11. The process for producing the photopolymerizable resinous composition defined in claim 1 comprising (i) preparing said photocurable prepolymer wherein said preparing step comprises reacting said at least one epoxide compound containing at least two epoxy groups with said first unsaturated carboxylic acid containing at least three vinyl linkages having the formula II with said second unsaturated carboxylic acid to form said first reaction product, then reacting said first reaction product with said polybasic acid anhydride to form said second reaction product, then reacting said second reaction product with said monoepoxide containing one vinyl group to form said photocurable prepolymer, and (ii) combining said photocurable prepolymer with said first photocurable monomer, said second photocurable monomer, said photopolymerization initiator, said curing agent, and said at least one organic solvent to form said photopolymerizable resinous composition.

12. The process for producing the photopolymerizable resinous composition defined in claim 11 further comprising preparing said first unsaturated carboxylic acid and said photocurable monomer comprising reacting pentaerythritol acrylate with polybasic acid anhydride wherein a proportion of polybasic acid anhydride is 0.8 to 1.1 moles to 1 equivalent of hydroxyl groups of said pentaerythritol acrylate.

* * * * *